United States Patent
Choi et al.

(10) Patent No.: US 7,808,458 B2
(45) Date of Patent: Oct. 5, 2010

(54) LIGHT EMITTING DISPLAY AND DRIVING METHOD THEREOF

(75) Inventors: Jin-Hyun Choi, Suwon-si (KR); Sung-Chon Park, Suwon-si (KR)

(73) Assignee: Samsung Mobile Display Co., Ltd., Yongin-si (KR)

(*) Notice: Subject to any disclaimer, the term of this patent is extended or adjusted under 35 U.S.C. 154(b) by 918 days.

(21) Appl. No.: 11/139,051

(22) Filed: May 27, 2005

(65) Prior Publication Data
US 2006/0027822 A1 Feb. 9, 2006

(30) Foreign Application Priority Data
Aug. 5, 2004 (KR) .................. 10-2004-0061734

(51) Int. Cl.
*G09G 3/30* (2006.01)
(52) U.S. Cl. .............. 345/77; 345/76; 345/92; 315/169.3; 324/750
(58) Field of Classification Search ............ 345/76, 345/77, 92; 315/63, 169.3; 324/750; 445/24
See application file for complete search history.

(56) References Cited

U.S. PATENT DOCUMENTS

| | | | | |
|---|---|---|---|---|
| 5,745,085 A * | 4/1998 | Tomio et al. | ............. | 345/63 |
| 5,949,194 A * | 9/1999 | Kawakami et al. | ....... | 315/169.4 |
| 6,593,934 B1 * | 7/2003 | Liaw et al. | ............ | 345/590 |
| 7,068,055 B2 * | 6/2006 | Hiroki | ............... | 324/750 |
| 7,071,905 B1 * | 7/2006 | Fan | ................. | 345/76 |
| 7,164,400 B2 * | 1/2007 | Mizukoshi et al. | ........ | 345/76 |
| 7,170,232 B2 * | 1/2007 | Miwa et al. | .......... | 315/169.3 |
| 2001/0041490 A1 * | 11/2001 | Nomura et al. | ............ | 445/24 |
| 2002/0044124 A1 * | 4/2002 | Yamazaki et al. | .......... | 345/92 |
| 2002/0105279 A1 * | 8/2002 | Kimura | ................ | 315/169.3 |
| 2003/0011314 A1 * | 1/2003 | Numao | ................ | 315/169.3 |
| 2003/0201955 A1 * | 10/2003 | Song et al. | ............ | 345/76 |

* cited by examiner

*Primary Examiner*—Amare Mengistu
*Assistant Examiner*—Premal Patel
(74) *Attorney, Agent, or Firm*—Christie, Parker & Hale, LLP

(57) ABSTRACT

A light emitting display displays an image on a display panel having a plurality of scan lines, a plurality of data lines, and a plurality of pixel circuits. In the light emitting display, one of the plurality of pixel circuits includes a light emitting element having a first electrode and a second electrode, and a current detector. The light emitting display further includes: a current estimator for estimating the amount of current flowing through the light emitting element; a controller for outputting a gamma compensation value; and a data driver for generating a data signal.

10 Claims, 7 Drawing Sheets

LIGHT EMITTING DISPLAY AND DRIVING METHOD THEREOF

CROSS REFERENCE TO RELATED APPLICATION

This application claims priority to and the benefit of Korean Patent Application No. 10-2004-0061734 filed on Aug. 5, 2004 in the Korean Intellectual Property Office, the entire content of which is incorporated herein by reference.

BACKGROUND OF THE INVENTION

1. Field of the Invention

The present invention relates to a display device, and more particularly, it relates to a light emitting display using electroluminescence of organic materials.

2. Description of the Related Art

In general, an organic light emitting diode (referred to as "OLED" hereinafter) display is a display device that electrically excites phosphorus organic components, and represents an image by voltage-programming or current-programming M×N numbers of organic light emitting pixels.

The organic light emitting pixels can also be referred to as organic light emitting diodes (hereinafter referred to as OLEDs), as they have characteristics similar to a diode. FIG. 1 schematically depicts a structure of an OLED. The OLED includes anode (e.g., indium tin oxide: ITO), organic thin film, and cathode (e.g., metal) layers. The organic thin film layer has a multi-layered structure including an emission layer (EML), an electron transport layer (ETL), and a hole transport layer (HTL) so as to balance electrons and holes and to thereby enhance efficiency of light emission. Further, the organic thin film separately includes an electron injection layer (EIL) and a hole injection layer (HIL). Several light emitting pixels (OLEDs) are arranged in a matrix format forming an organic electroluminescence display panel.

Methods of driving the organic light emitting pixels having the foregoing configuration include a passive matrix method and an active matrix method. The active matrix method employs a thin film transistor (TFT). In the passive matrix method, an anode and a cathode are formed crossing each other, and a line is selected to drive the organic light emitting pixels. In the active matrix method, a pixel electrode of indium tin oxide (ITO) is coupled to the TFT and a voltage maintained by capacitance of a capacitor coupled to a gate of the TFT drives the light emitting pixel. The active matrix method hence has a rather complicated pixel circuit but the pixel circuit of this driving method emits light longer and consumes less current, thereby enhancing display quality.

Also, the lifespan of the OLED is determined by the amount of current flowing thereto, and thus the lifespan of the OLED is reduced as the amount (or total amount) of current flowing to the OLED is increased. Accordingly, a method for improving display quality while reducing the amount (or total amount) of current flowing to the OLED is desired.

SUMMARY OF THE INVENTION

An embodiment of the present invention provides a light emitting display and a driving method thereof to control the amount of current flowing to an OLED in accordance with the amount of current flowing to a cathode of the OLED.

In addition, the light emitting display and the driving method thereof according to an embodiment of the present invention displays a more natural image (as compared with a conventional display and a driving method thereof) while reducing the amount (or total amount) of current flowing to the OLED.

One embodiment of the present invention provides a light emitting display for displaying an image on a display panel having a plurality of scan lines, a plurality of data lines, and a plurality of pixel circuits. The plurality of scan lines transmit selection signals. The plurality of data lines transmit data signals. The plurality of pixel circuits are respectively coupled to the scan lines and the data lines. One of the plurality of pixel circuits includes a light emitting element and a current detector. The light emitting element has a first electrode and a second electrode. At least one of the data signals transmitted through at least one of the data lines is applied to the second electrode. The current detector is for detecting a current flowing through the light emitting element. The light emitting display includes a current estimator, a controller, and a data driver. The current estimator estimates an amount of the current flowing through the light emitting element using the current detector and outputs a detection signal in response to the estimated amount of the current. The controller outputs a gamma compensation value corresponding to the detection signal. The data driver generates a gamma-compensated data signal based on the gamma compensation value and applies the gamma-compensated data signal to at least one of the data lines.

The data driver may include a gamma compensator for generating a grayscale voltage corresponding to each level of grayscale based on the gamma compensation value, and the data driver may generate the gamma-compensated data signal based on the grayscale voltage.

The current detector may be an impedance element coupled to the first electrode of the light emitting element.

The current estimator may include a voltage detector for detecting a voltage at an end of the impedance element, and a current amount estimator for estimating the amount of the current flowing through the light emitting element using the voltage detected at the end of the impedance element.

The current amount estimator may estimate a total amount of the current of each of the plurality of pixel circuits.

One embodiment of the present invention provides a light emitting display for displaying an image on a display panel having a plurality of scan lines, a plurality of data lines, and a plurality of pixel circuits. The plurality of scan lines transmit selection signals. The plurality of data lines transmit data signals. The plurality of pixel circuits are respectively coupled to the scan lines and the data lines. At least one of the plurality of pixel circuits respectively includes a light emitting element and a current detector. The light emitting element has a first electrode and a second electrode. At least one of the data signals transmitted through at least one of the data lines is applied to the second electrode. The current detector is for detecting a current flowing through the light emitting element. The light emitting display includes a current estimator, a controller, a gamma compensator, and a data driver. The current estimator estimates an amount of the current flowing through the light emitting element using the current detector and outputs a detection signal in response to the estimated amount of the current. The controller outputs a gamma reference voltage corresponding to the detection signal. The gamma compensator generates a grayscale voltage corresponding to each level of grayscale based on the gamma reference voltage. The data driver receives the grayscale voltage from the gamma compensator, generates a gamma-compensated data signal, and applies the gamma-compensated data signal to at least one of the data lines.

One embodiment of the present invention provides a driving method of a light emitting display including a plurality of light emitting elements emitting light for displaying an image thereon. In the method, a) an amount of current flowing to a cathode of at least one of the light emitting elements is estimated, b) a gamma compensation value in response to the estimated amount of current is determined, c) a gamma-compensated data signal is generated based on the determined gamma compensation value, and d) a current corresponding to the data signal is applied to an anode of the at least one of the light emitting elements.

BRIEF DESCRIPTION OF THE DRAWINGS

The accompanying drawings, together with the specification, illustrate exemplary embodiments of the present invention, and, together with the description, serve to explain the principles of the invention.

DETAILED DESCRIPTION

Figure 1:
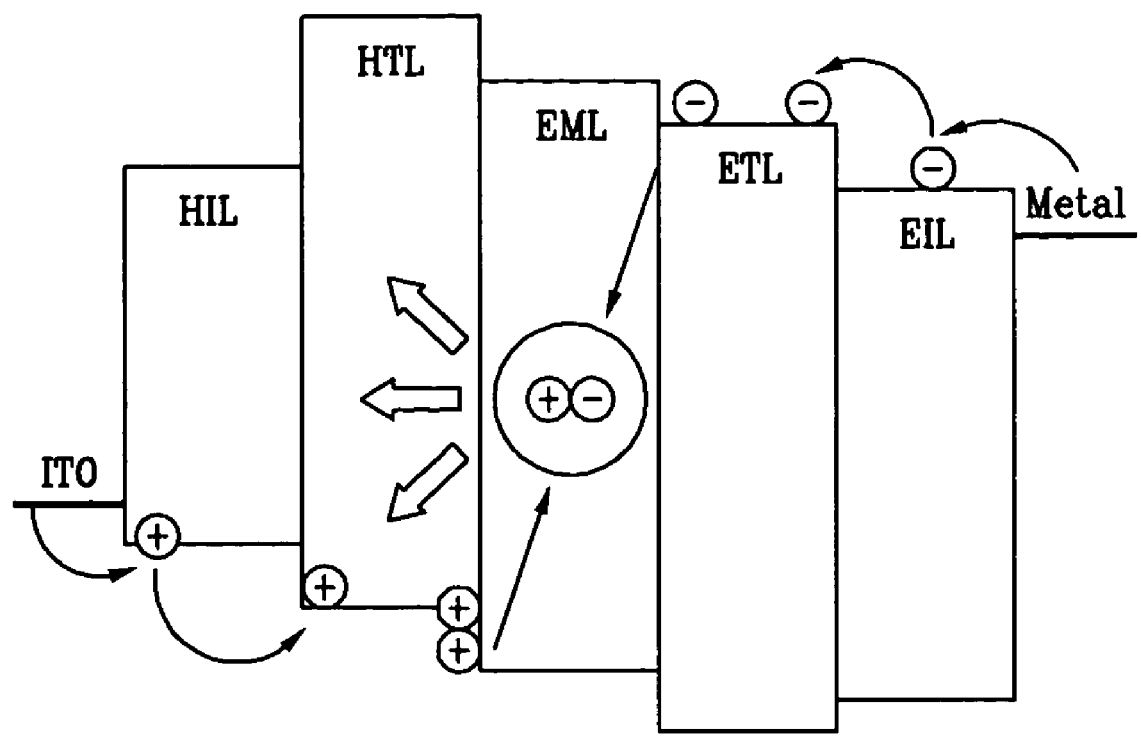
FIG. 1 schematically depicts a structure of an OLED.

In the following detailed description, only certain exemplary embodiments of the present invention are shown and described, simply by way of illustration. As those skilled in the art would realize, the described embodiments may be modified in various different ways, all without departing from the spirit or scope of the present invention. Accordingly, the drawings and description are to be regarded as illustrative in nature, and not restrictive. There may be parts shown in the drawings, or parts not shown in the drawings, that are not discussed in the specification as they are not essential to a complete understanding of the invention. Like reference numerals designate like elements.

Figure 2:
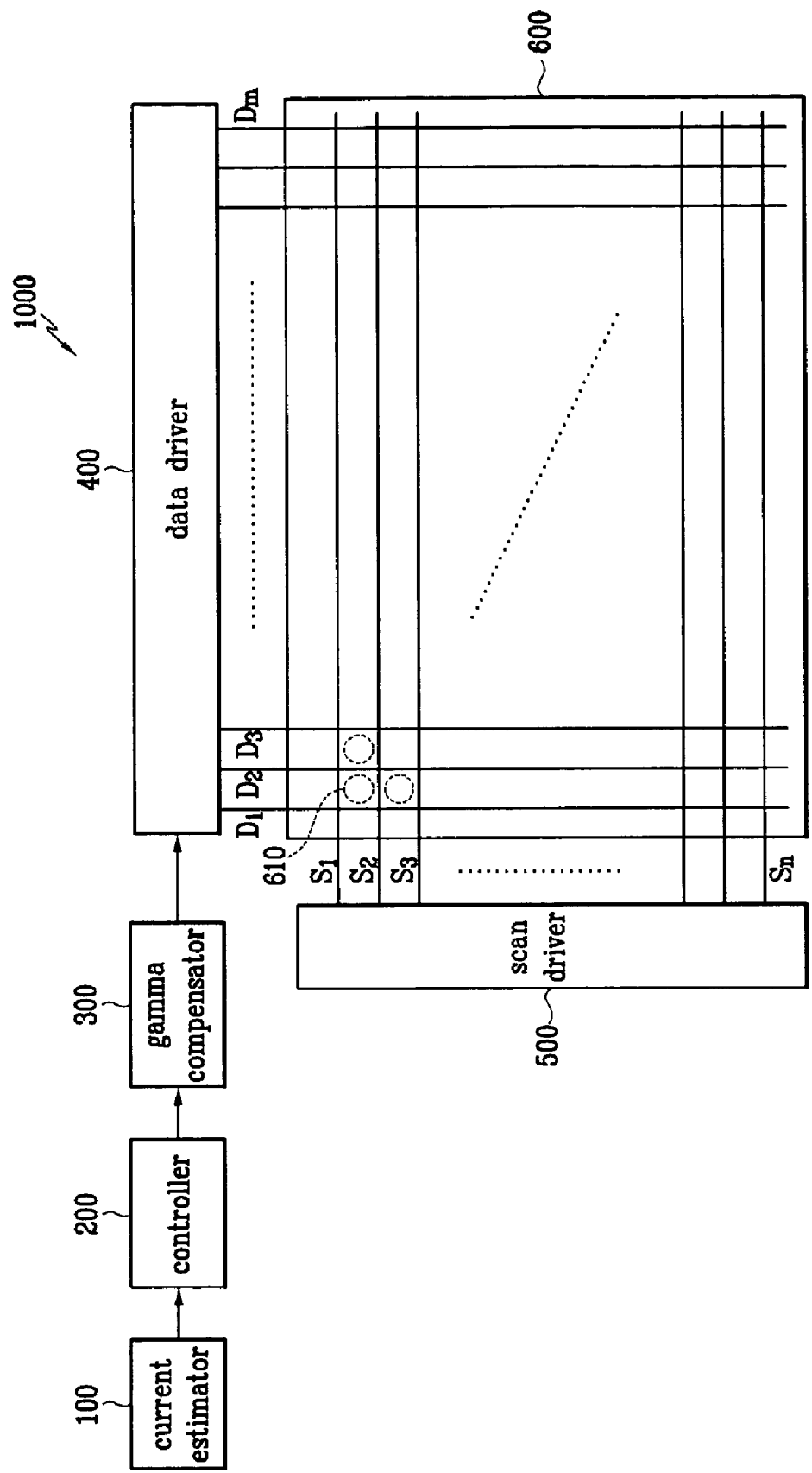
FIG. 2 schematically depicts a configuration of a light emitting display according to a first embodiment of the present invention.

FIG. 2 schematically illustrates a configuration of a light emitting display 1000 according to a first embodiment of the present invention. As shown, the light emitting display 1000 includes a current estimator 100, a controller 200, a gamma compensator 300, a data driver 400, a scan driver 500, and a display panel 600.

The display panel 600 includes a plurality of data lines D1 to Dm arranged in columns, a plurality of scan lines S1 to Sn arranged in rows, and a plurality of pixel circuits 610. The data lines D1 to Dm are used for transmitting data signals as image signals to the pixel circuits 610, and the scan lines S1 to Sn are used for transmitting selection signals to the pixel circuits 610. Each pixel circuit 610 is defined by two adjacent data lines of the data lines D1 to Dm and two adjacent scan lines of the scan lines S1 to Sn. Accordingly, a selected pixel circuit 610 emits light corresponding to a data signal of the data signals transmitted from the data driver 400 based on the data of red, green, and blue, and thus the display panel 600 displays an image corresponding to the data of red, green, and blue (hereinafter, referred to as the RGB data) applied thereto.

The current estimator 100 estimates a current flowing to an OLED of each circuit pixel 610, and outputs a detection signal in response to the estimated current to the controller 200.

The controller 200 outputs a gamma compensation value corresponding to the detection signal transmitted from the current estimator 100 to the gamma compensator 300.

Figure 4:
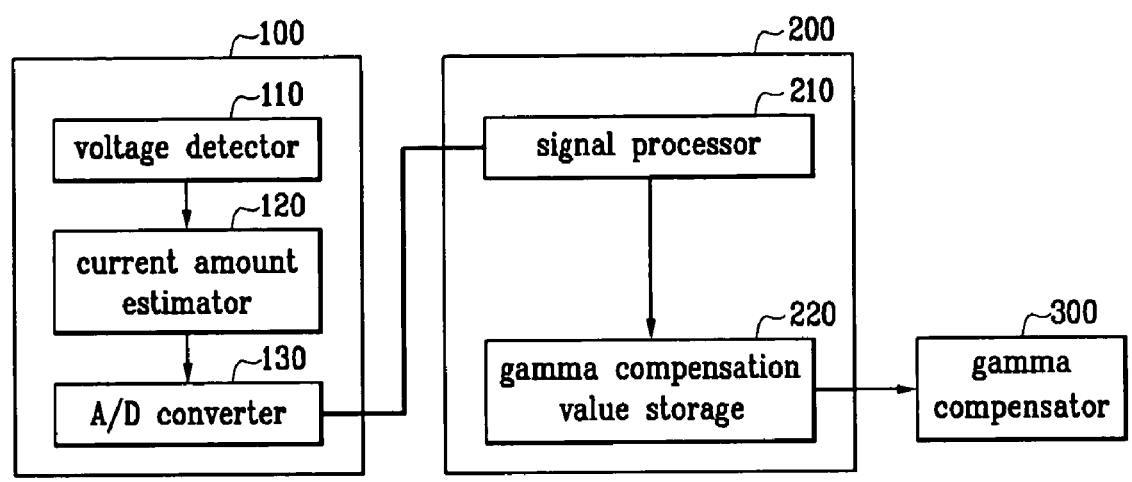
FIG. 4 depicts a configuration of a current estimator and a controller of FIG. 2 in more detail.

Referring also to FIG. 4, the gamma compensator 300 receives the gamma compensation value stored in a gamma compensation value storage 220 from the controller 200, generates a grayscale voltage based on the gamma compensation value, and outputs the grayscale voltage to the data driver 400.

The scan driver 500 sequentially transmits the selection signals to the scan lines S1 to Sn of the display panel 600. The data driver 400 generates a gamma-compensated data voltage $V_{DATA}$ on the basis of the RGB data and the grayscale voltage transmitted from the gamma compensator 300, and respectively applies it to the data lines D1 to Dm of the display panel 600. By using the gamma compensation value corresponding to the detection signal generated from the current estimator 100, the data voltage $V_{DATA}$ to be applied to the data lines D1 to Dm of the display panel 600 can be controlled to thereby display a more natural image (or a corrected or compensated image).

Figure 3:
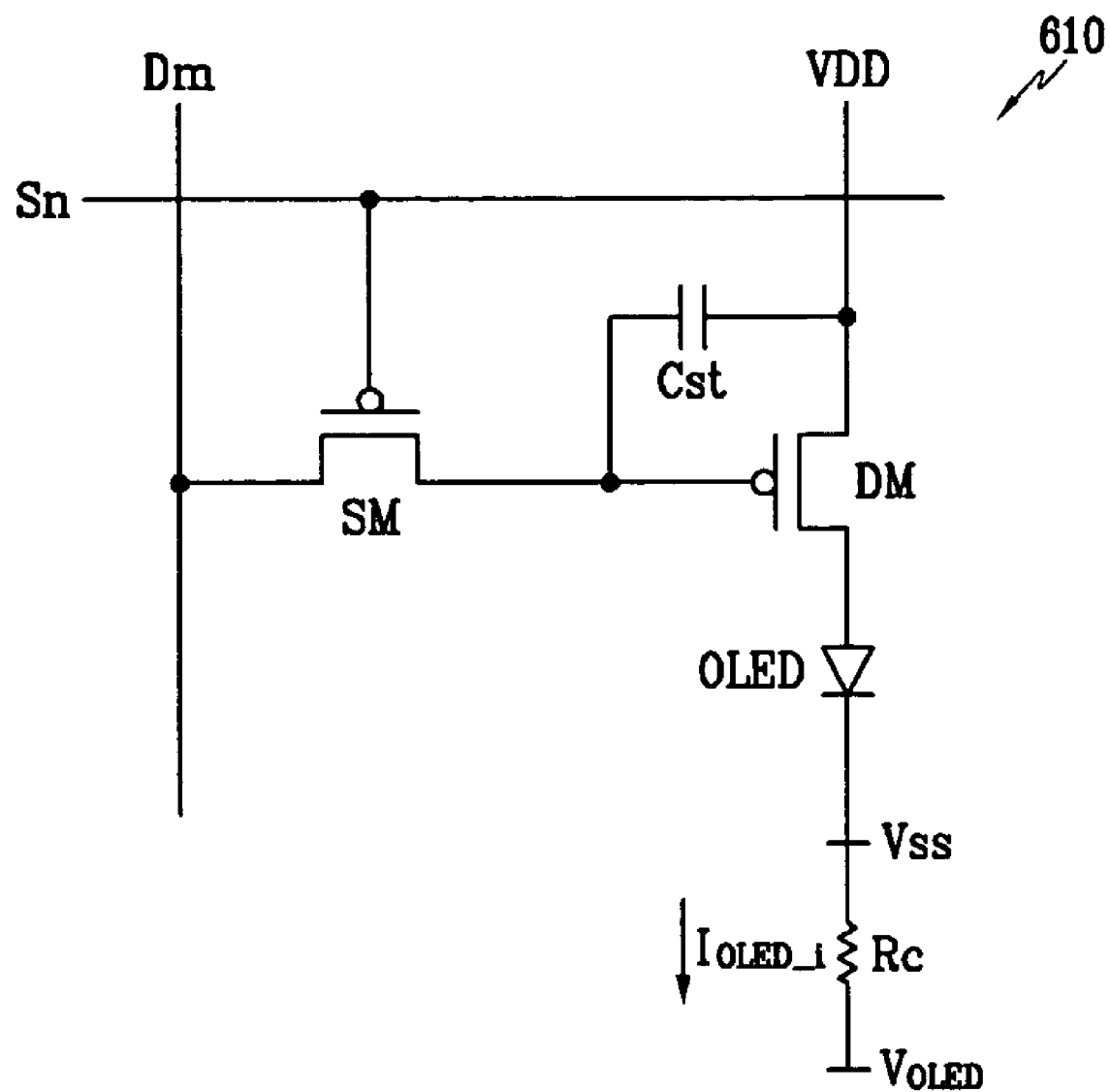
FIG. 3 is an equivalent circuit diagram exemplarily illustrating a pixel circuit according to the first embodiment of the present invention.

FIG. 3 is an equivalent circuit diagram exemplarily showing a pixel circuit 610 according to the first embodiment of the present invention. As shown therein, the pixel circuit 610 includes an OLED, a switching transistor SM, a driving transistor DM, and a capacitor Cst. In FIG. 3, the switching and driving transistors SM and DM are PMOS transistors. However, other suitable transistor types (e.g., NMOS transistors) may be used and the present invention is not thereby limited.

A gate electrode of the switching transistor SM is coupled to a scan line Sn, a source electrode of the switching transistor SM is coupled to a data line Dm, and a drain electrode of the switching transistor SM is coupled to a first end of the capacitor Cst and a gate electrode of the driving transistor DM. A second end of the capacitor Cst is coupled to a power voltage VDD. A source electrode of the driving transistor DM is coupled to the power voltage VDD, and a drain electrode of the driving transistor DM is coupled to an anode of the OLED. A cathode of the OLED is coupled to a reference voltage Vss, and emits light in response to a current applied through the driving transistor DM. In this embodiment, the power voltage Vss coupled to the cathode of the OLED is lower than the power voltage VDD, and a ground voltage may be used instead of the power voltage Vss.

In operation, a selection signal is applied to the scan line Sn and the switching transistor SM is turned on, and the data voltage $V_{DATA}$ is transmitted to the first end of the capacitor Cst and the gate electrode of the driving transistor DM. Because of this, a gate-source voltage $V_{GS}$ of the driving transistor DM is maintained for a predetermined time period. Further, the driving transistor DM applies a current $I_{OLED}$ corresponding to the gate-source voltage $V_{GS}$ to the OLED and the OLED emits light. In this embodiment, the current $I_{OLED}$ flowing to the OLED is given as Equation 1.

$$I_{OLED} = \frac{\beta}{2}(V_{GS} - V_{TH})^2 = \frac{\beta}{2}(V_{DD} - V_{DATA} - |V_{TH}|)^2 \quad \text{[Equation 1]}$$

As shown in Equation 1, when a high data voltage $V_{DATA}$ is applied to the gate electrode of the driving transistor DM, the gate-source voltage $V_{GS}$ of the driving transistor DM becomes low, and consequently a small amount of current $I_{OLED}$ flows to the pixel electrode and the OLED emits less light, thereby displaying lower grayscales. By contrast, when a low data voltage $V_{DATA}$ is applied to the gate electrode of the driving transistor DM, the gate-source voltage $V_{GS}$ of the driving transistor DM becomes high, and consequently a large amount of current flows to the OLED, and the OLED emits a lot of light, thereby displaying higher grayscales. Because of this, data voltage $V_{DATA}$ applied to each of the pixel circuits 610 is leveled on the basis of an image data signal to be displayed (e.g., its grayscale), and the amount of current $I_{OLED}$ that flows to the OLED is determined by the data voltage $V_{DATA}$.

In addition, when the current $I_{OLED}$ is applied through the drain of the driving transistor DM, an inner current $I_{OLED\_i}$ flows into the OLED. However, the amount of the inner current $I_{OLED\_i}$ varies depending on surrounding temperature although an equivalent current $I_{OLED}$ is applied to the anode of the OLED. In other words, the amount of inner current $I_{OLED\_i}$ is increased when the surrounding temperature is high (and decreased when the surrounding temperature is low) although the equivalent current $I_{OLED}$ is applied to the anode of the OLED. Accordingly, to properly control the current $I_{OLED}$ applied to the anode (in other words, the data voltage $V_{DATA}$ applied to the data lines) the size of the inner current $I_{OLED\_i}$ should be estimated (and/or compensated.)

According to the first embodiment of the present invention, a current detector or predetermined resistor Rc is coupled to the cathode of the OLED of each pixel to estimate the inner current $I_{OLED\_i}$ of the OLED, as shown in FIG. 3. When the inner current $I_{OLED\_i}$ is controlled to flow through the resistor Rc, the resistor Rc causes a voltage drop. Thus, the size of the inner current $I_{OLED\_i}$ can be estimated using the resistor Rc and the voltage drop.

FIG. 4 shows a configuration of the current estimator 100 and the controller 200 of FIG. 2 in more detail.

The current estimator 100 includes a voltage detector 110, a current amount estimator 120, and an analog/digital (A/D) converter 130. The voltage detector 110 detects a voltage $V_{OLED}$ at an end of the resistor Rc in each pixel in FIG. 3, and outputs the detected voltage $V_{OLED}$ to the current amount estimator 120. The current amount estimator 120 receives the voltage $V_{OLED}$ of each pixel circuit 610 to estimate a total amount of inner current $I_{OLED\_i}$ of the respective pixel circuit 610 in the display panel 600, and outputs an analog detection signal in response to the total amount of the inner current $I_{OLED\_i}$ to the A/D converter 130. The A/D converter 130 converts the analog detection signal outputted from the current amount estimator 120 into a digital detection signal, and outputs the digital detection signal. According to the first embodiment of the present invention, the total amount of the inner current $I_{OLED\_i}$ of each pixel circuit 610 is estimated by the current amount estimator 120, but the voltage detector 110 may estimate the total amount of the inner current $I_{OLED\_i}$ of each pixel circuit 610 and may output the total amount to the current amount estimator 120.

The controller 200 outputs a gamma compensation value corresponding to the detection signal outputted from the current estimator 100 to the gamma compensator 300. The controller 200 includes a detection signal processor 210, and a gamma compensation value storage 220. The detection signal processor 210 outputs a storage control signal to control the gamma compensation value storage 220 to output the gamma compensation value corresponding to the detection signal.

The storage control signal may include an address for locating the gamma compensation value that is stored in response to the estimated current. The gamma compensation value storage 220 stores the gamma compensation values respectively corresponding to detection signals in a lookup table (LUT) format, and outputs a corresponding gamma compensation value to the gamma compensator 300 based on the storage control signal.

In this embodiment, the gamma compensation value storage 220 may be a programmable memory. For example, the programmable memory includes a Programmable Read Only Memory (PROM), an Erasable Programmable Read Only Memory (EPROM), an Electrically Erasable Programmable Read Only Memory (EEPROM), and a flash memory. The signal processor 210 or a separate storage controller (not shown) may program the gamma compensation value storage 220. Since the gamma compensation value storage 220 is programmable, a gamma reference voltage may be customized and programmed into the complete light emitting display 1000 for an end-user.

In more detail, the complete display 1000 may have various features depending on a condition of a manufacturing process. Consequentially, gamma compensation may be inadequately processed when the complete display 1000 uses a fixed gamma compensation value using a non-programmable memory, for example a mask ROM.

Because of this, in one embodiment of the present invention by applying a programmable memory to the complete display 1000, the gamma compensation is adequately processed without regard to the condition of the manufacturing process.

Figure 5:
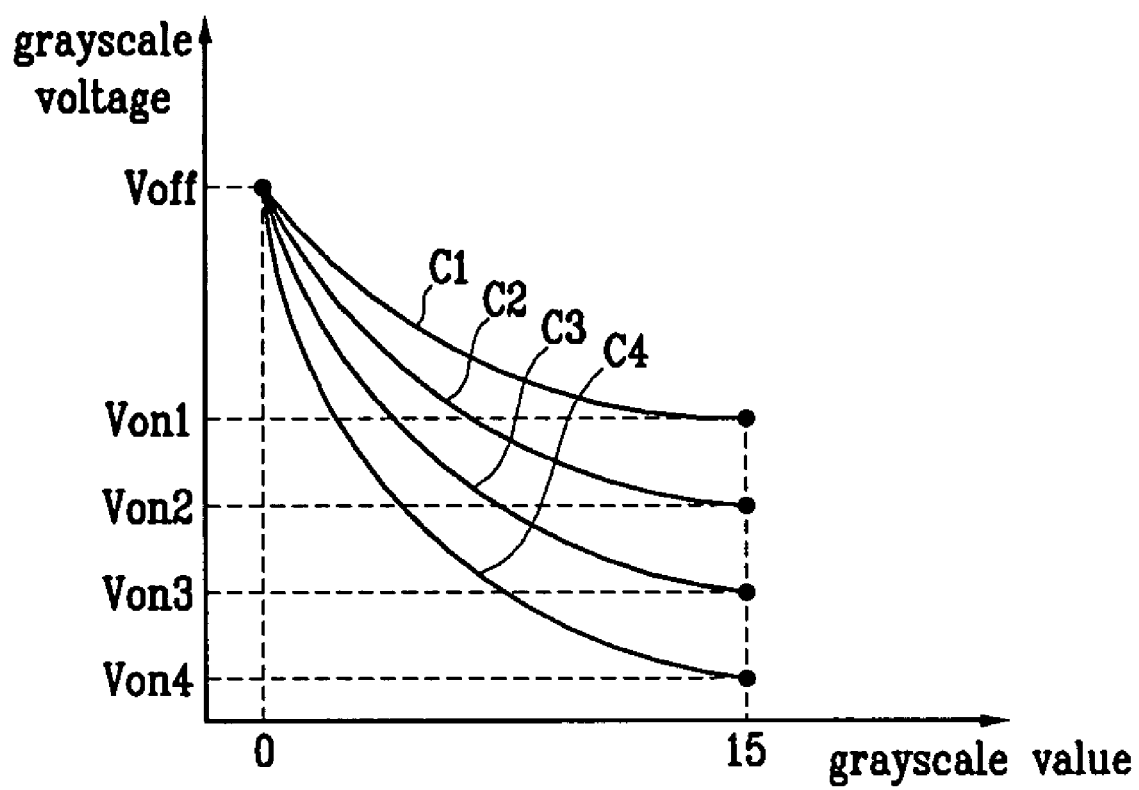
FIG. 5 is a graph exemplarily explaining a gamma compensation value stored in a gamma compensation value storage of FIG. 4.

FIG. 5 is a graph explaining an example of a gamma compensation value stored in the gamma compensation value storage 220. In FIG. 5, the horizontal axis represents a grayscale value and the vertical axis represents grayscale voltages respectively corresponding to each level of the grayscales. In other words, the graph illustrates the grayscale voltages corresponding to the respective grayscales and thus is referred to as a gamma curve. Through the gamma compensation, a non-linear characteristic of brightness of the display panel 600 with respect to the RGB data inputted to the data driver 400 is compensated. An off voltage Voff corresponds to a black color (grayscale 0), and an on voltage Von corresponds to a white color (grayscale 15). The degree of slope represents the slope variation of the gamma curve. The slope variation of a gamma curve corresponding to the reference numeral C2 is greater than the slope variation of a gamma curve corresponding to the reference numeral C1, but is smaller than the slope variation of a gamma curve corresponding to the reference numeral C3. In addition, C1 represents a gamma curve corresponding to a detection signal when the surrounding temperature is the lowest, C2 represents a gamma curve corresponding to the detection signal when the surrounding temperature is comparatively low, and the reference C3 represents a gamma curve corresponding to the detection signal when the surrounding temperature is comparatively high, and C4 represents a gamma curve corresponding to the detection signal when the surrounding temperature is highest.

As shown in FIG. 5, when the value of the off voltage Voff is fixed, the gamma compensation value may be on voltages Von1, Von2, Von3, and Von4 respectively corresponding to gamma curves C1, C2, C3, and C4, and may have slope degrees of the respective gamma curves C1, C2, C3, and C4. This gamma compensation value is stored in the gamma compensation value storage 220 in the LUT format, together with its corresponding surrounding temperature value.

As described, according to the first embodiment of the present invention, the display 1000 controls the gamma compensation value to reduce the size of the data voltage $V_{DATA}$ when the total amount of the current flowing to the OLED is high so as to display a bright image, and the display 1000 controls the gamma compensation value to increase the size of the data voltage $V_{DATA}$ when the total amount of the current flowing to the OLED is low so as to display a dark image, thereby more naturally displaying images while extending the lifetime of the OLED by way of reducing the amount (or total amount) of current applied to the OLED.

Figure 6:
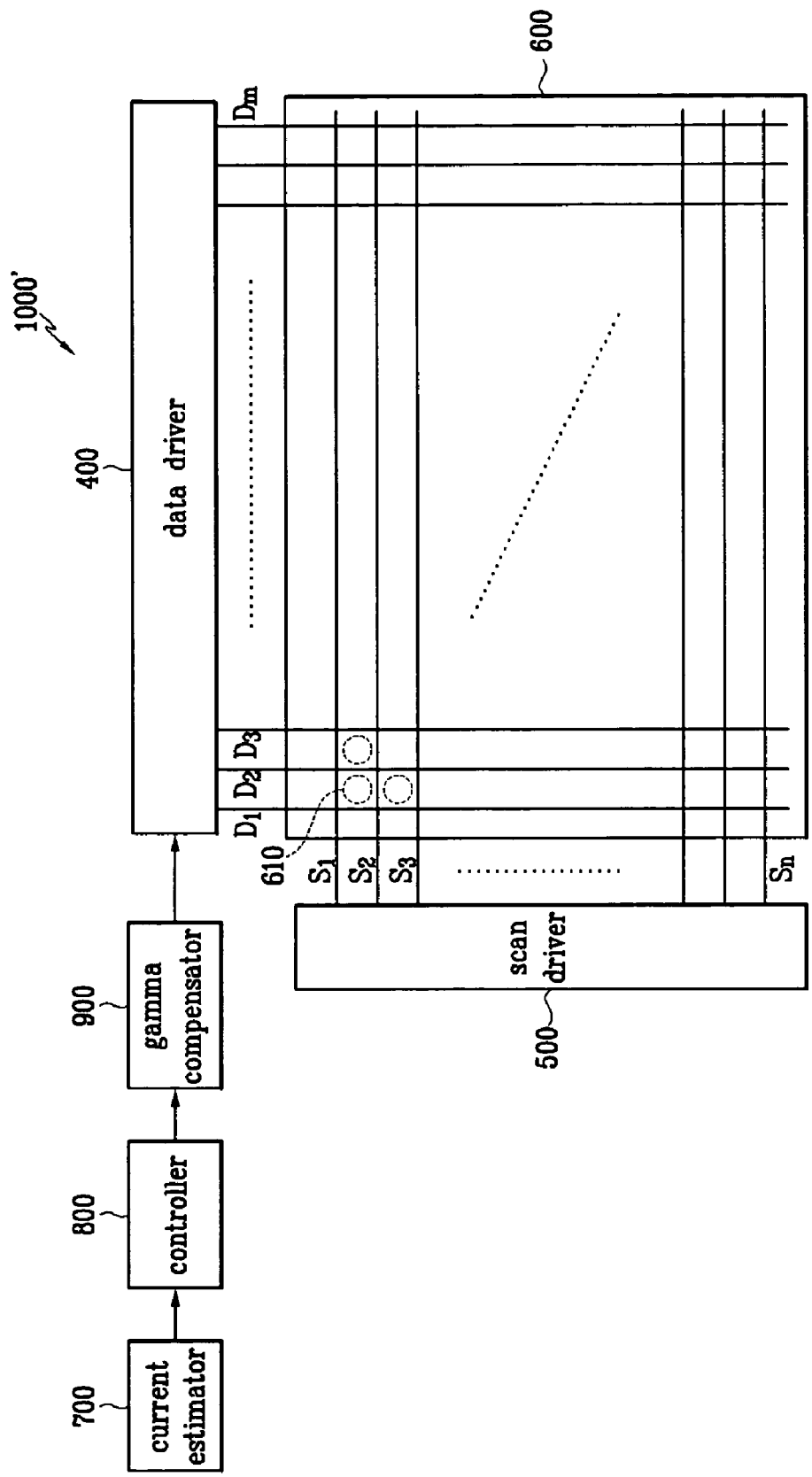
FIG. 6 schematically illustrates a configuration of a light emitting display according to a second embodiment of the present invention.
Figure 7:
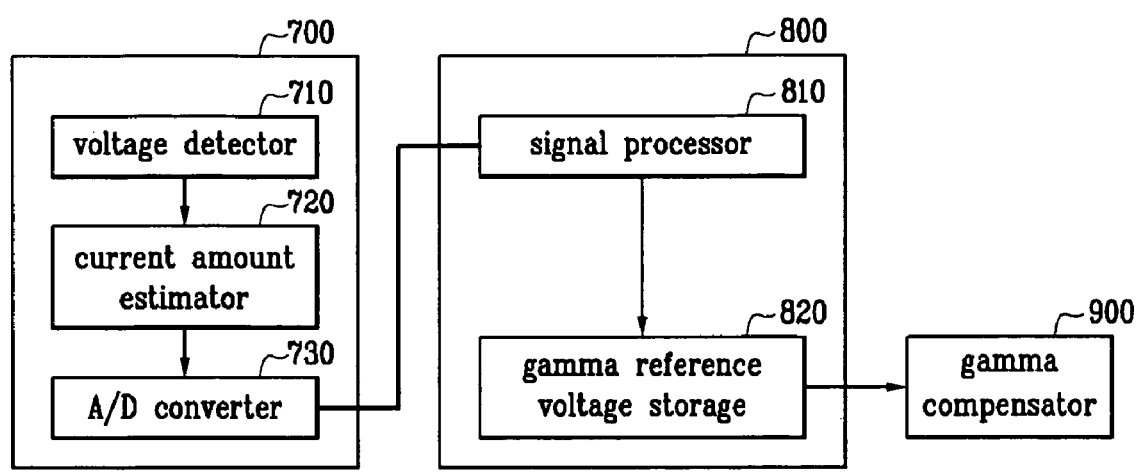
FIG. 7 illustrates a configuration of a current estimator and a controller of FIG. 6 in more detail.

With reference to FIG. 6 and FIG. 7, a light emitting display 1000' according to a second embodiment of the present invention will be described in detail.

According to the second embodiment of the present invention, and differing from the first embodiment of the present invention, reference voltages (rather than gamma compensation values) are generated respectively corresponding to the respective grayscales in accordance with the estimated amount of current.

FIG. 6 schematically illustrates a configuration of the light emitting display 1000' according to the second embodiment of the present invention. The light emitting display 1000' according to the second embodiment of the present invention includes a current estimator 700, a controller 800, a gamma compensator 900, a data driver 400, a scan driver 500, and a display panel 600. The data driver 400, the scan driver 500, and the display panel 600 of the light emitting display according to the second embodiment of the present invention correspond to those of the first embodiment of the present invention.

In this embodiment, the current estimator 700 detects a voltage $V_{OLED}$ at an end of the resistor Rc in FIG. 3, and estimates a current $I_{OLED\_i}$ on the basis of the voltage $V_{OLED}$ and a value of the resistor Rc. Further, the current estimator 700 outputs a detection signal in response to the estimated current to the controller 800.

The controller 800 outputs consecutive gamma reference voltage data (e.g., gamma reference voltages) corresponding to the detection signals transmitted from the current estimator 700 to the gamma compensator 900. The gamma compensator 900 generates grayscale voltages respectively corresponding to the respective grayscales based on the gamma reference voltage data transmitted from the controller 800 and outputs the grayscale voltages to the data driver 400.

FIG. 7 shows a configuration of the current estimator 700 and the controller 800 of FIG. 6 in more detail. The current estimator 700 includes a voltage detector 710, a current amount estimator 720, and an A/D converter 730. The voltage detector 710 detects the voltage $V_{OLED}$ at the end of the resistor Rc in each pixel circuit 610 in FIG. 3, estimates a total voltage $V_{OLED}$ in each pixel of the display panel 600, and outputs the total voltage $V_{OLED}$ to the current amount estimator 720. The current amount estimator 720 receives the total voltage $V_{OLED}$ of the respective pixels, estimates the total amount of the current $I_{OLED\_i}$ of the respective pixel circuit 610 of the display panel 600, and outputs an analog detection signal corresponding to the total amount of the current $I_{OLED\_i}$ to the A/D converter 730. The A/D converter 730 converts the analog detection signal outputted from the current amount estimator 720 into a digital detection signal and outputs the digital detection signal to the controller 800.

The controller 800 then outputs a reference voltage corresponding to the detection signal outputted from the current estimator 700 to the gamma compensator 900. The controller 800 includes a detection signal processor 810 and a gamma reference voltage storage 820. The detection signal processor 810 outputs a storage control signal to control the gamma reference voltage storage 820 to output the reference voltage corresponding to the detection signal. The storage control signal may include an address for locating the gamma reference voltage data that is stored in response to the estimated current. The gamma reference voltage storage 820 stores the gamma reference voltage data respectively corresponding to the detection signals in a lookup table (LUT) format, and outputs a reference voltage data (e.g., a reference voltage) based on the storage control signals to the gamma compensator 900.

In this embodiment, the gamma reference voltage storage 820 may be a programmable memory. For example, the programmable memory includes a Programmable Read Only Memory (PROM), an Erasable Programmable Read Only Memory (EPROM), an Electrically Erasable Programmable Read Only Memory (EEPROM), and a flash memory.

The gamma reference voltage data stored in the gamma reference voltage storage 820 may include an off voltage data corresponding to a black grayscale and an on voltage data corresponding to a white grayscale. Further, the gamma reference voltage storage 820 may store intermediate voltage data respectively corresponding to a plurality of intermediate grayscales between the black grayscale and the white grayscale. In addition, the gamma reference voltage storage 820 may store on voltage data and off voltage data respectively corresponding to red, green, and blue grayscales as separate gamma reference voltage data.

The gamma compensator 900 generates a grayscale voltage data respectively corresponding to a whole grayscale level on the basis of the gamma reference voltage data outputted from the data controller 800, converts the grayscale voltage data into an analog signal, and outputs the analog signal to the data driver 400.

In view of the foregoing, the size of the data voltage $V_{DATA}$ applied to the display panel 600 can be controlled by estimating the amount of current flowing to the OLED and modifying the gamma reference voltage according to the estimated current. Thus, the amount (or total amount) of current flowing to the OLED can be reduced by reducing the size of the data voltage $V_{DATA}$ when a relatively large amount of current flows to the OLED (and increasing the level of the data voltage $V_{DATA}$ when a relatively small amount of current flows to the OLED).

In general, a light emitting display according to the present invention uses a gamma compensation value in response to the amount of current, and controls the size of a data voltage on the basis of the current flowing to the OLED. In other words, data voltages respectively applied to data lines can be controlled on the basis of a total amount of current flowing to the OLED of the display to thereby display more natural images, and extend the life time of the OLED by way of reducing the amount (or total amount) of current flowing to the OLED.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A light emitting display for displaying an image on a display panel having a plurality of scan lines for transmitting selection signals, a plurality of data lines for transmitting data signals, and a plurality of pixel circuits coupled to the scan lines and the data lines, each of the plurality of pixel circuits comprising: a light emitting element having a first electrode and a second electrode, wherein at least one of the data signals transmitted through at least one of the data lines is applied to the second electrode; and a dedicated current detector for detecting a current flowing through the light emitting element of the pixel circuit, the light emitting display comprising:
- a current estimator for estimating an amount of the current flowing through the light emitting element using the dedicated current detector, and for outputting a detection signal in response to the amount of the current;
- a controller for outputting a gamma compensation value corresponding to the detection signal; and
- a data driver for generating a gamma-compensated data signal based on the gamma compensation value and for applying the gamma-compensated data signal to at least one of the data lines, wherein the plurality of pixel circuits comprises:
- a first pixel circuit coupled to one data line of the plurality of data lines wherein the dedicated current detector of the first pixel circuit is for detecting a first current flowing through the light emitting element of the first pixel circuit, and
- a second pixel circuit coupled to the one data line wherein the dedicated current detector of the second pixel circuit is for detecting a second current flowing through the light emitting element of the second pixel circuit, and wherein the gamma compensation values of the first and second pixel circuits comprise values corresponding to the first and second currents to correct at least one gamma curve for the light emitting elements of the first and second pixel circuits.

2. The light emitting display of claim 1, wherein the data driver comprises a gamma compensator for generating a grayscale voltage corresponding to grayscale levels based on the gamma compensation value, and wherein the data driver generates the gamma-compensated data signal based on the grayscale voltage.

3. The light emitting display of claim 1, wherein the dedicated current detector is an impedance element coupled to the first electrode of the light emitting element.

4. The light emitting display of claim 3, wherein the current estimator comprises a voltage detector for detecting a voltage across the impedance element, and a current amount estimator for estimating the amount of the current flowing through the light emitting element using the voltage detected across the impedance element.

5. The light emitting display of claim 4, wherein the current amount estimator is configured to estimate a total amount of the current of each of the plurality of pixel circuits.

6. A light emitting display for displaying an image on a display panel having a plurality of scan lines for transmitting selection signals, a plurality of data lines for transmitting data signals, and a plurality of pixel circuits coupled to the scan lines and the data lines, each of the plurality of pixel circuits comprising: a light emitting element having a first electrode and a second electrode, wherein at least one of the data signals transmitted through at least one of the data lines is applied to the second electrode; and a dedicated current detector for detecting a current flowing through the light emitting element of the pixel circuit, the light emitting display comprising:
- a current estimator for estimating an amount of the current flowing through the light emitting element using the dedicated current detector, and for outputting a detection signal in response to the amount of the current;
- a controller for outputting a gamma reference voltage corresponding to the detection signal;
- a gamma compensator for generating a grayscale voltage corresponding to grayscale voltages based on the gamma reference voltage; and
- a data driver for receiving the grayscale voltage from the gamma compensator, for generating a gamma-compensated data signal, and for applying the gamma-compensated data signal to at least one of the data lines, wherein the plurality of pixel circuits comprises:
- a first pixel circuit coupled to one data line of the plurality of data lines wherein the dedicated current detector of the first pixel circuit is for detecting a first current flowing through the light emitting element of the first pixel circuit, and
- a second pixel circuit coupled to the one data line wherein the dedicated current detector is for detecting a second current flowing through the light emitting element of the second pixel circuit, and wherein the gamma reference voltages of the first and second pixel circuits comprise voltages corresponding to the first and second currents to correct at least one gamma curve for the light emitting elements of the first and second pixel circuits.

7. The light emitting display of claim 6, wherein the dedicated current detector comprises an impedance element coupled to the first electrode of the light emitting element.

8. The light emitting display of claim 7, wherein the current estimator comprises a voltage detector for detecting a voltage across the impedance element, and a current amount estimator for estimating the amount of the current flowing through the light emitting element using the voltage detected across the impedance element.

9. The light emitting display of claim 8, wherein the current estimator is configured to estimate a total voltage across the impedance element coupled to the light emitting element.

10. A driving method of a light emitting display comprising a plurality of light emitting elements in a plurality of pixel circuits and emitting light for displaying an image thereon, the driving method comprising:
- detecting a first current flowing through the light emitting element of a first pixel circuit of the plurality of pixel circuits utilizing a first current detector, the first pixel circuit being coupled to one data line of a plurality of data lines and comprising the first current detector;
- estimating an amount of the first current flowing to a cathode of the light emitting element of the first pixel circuit;
- determining a first gamma compensation value in response to the estimated amount of the first current;
- generating a first gamma-compensated data signal based on the determined first gamma compensation value;
- applying a current corresponding to the data signal to an anode of the light emitting element of the first pixel circuit;
- detecting a second current flowing through the light emitting element of a second pixel circuit of the plurality of pixel circuits utilizing a second current detector, the second pixel circuit being coupled to the one data line and comprising the second current detector; and
- determining a second gamma compensation value corresponding to the second current, wherein the first and second gamma compensation values correspond to the first and second currents to correct at least one gamma curve for the light emitting elements of the first and second pixel circuits.

* * * * *